(12) United States Patent
Erentok et al.

(10) Patent No.: US 10,588,218 B2
(45) Date of Patent: Mar. 10, 2020

(54) ANTENNA ON TRANSPARENT SUBSTRATE

(71) Applicant: Intel Corporation, Santa Clara, CA (US)

(72) Inventors: Aycan Erentok, Santa Clara, CA (US); Seung Jun Lee, Santa Clara, CA (US); Amit Singh, Santa Clara, CA (US); Paul Beaucourt, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/485,035

(22) Filed: Apr. 11, 2017

(65) Prior Publication Data

US 2018/0294552 A1 Oct. 11, 2018

(51) Int. Cl.
| | |
|---|---|
| *H01Q 1/44* | (2006.01) |
| *H05K 1/09* | (2006.01) |
| *G06F 1/16* | (2006.01) |
| *H04B 5/00* | (2006.01) |
| *G06F 3/041* | (2006.01) |
| *H01Q 7/00* | (2006.01) |

(52) U.S. Cl.
CPC ............... *H05K 1/09* (2013.01); *G06F 1/163* (2013.01); *G06F 1/1641* (2013.01); *G06F 1/1698* (2013.01); *G06F 3/041* (2013.01); *H04B 5/0031* (2013.01); *H04B 5/0056* (2013.01); *H04B 5/0081* (2013.01); *H01Q 1/44* (2013.01); *H01Q 7/00* (2013.01); *H04B 5/00* (2013.01)

(58) Field of Classification Search
CPC ........... G06F 1/163; G06F 3/044; H05K 1/09; H01Q 1/273

USPC ................... 343/702, 718; 345/178; 174/255
See application file for complete search history.

(56) References Cited

U.S. PATENT DOCUMENTS

| | | | |
|---|---|---|---|
| 9,293,806 B2 * | 3/2016 | Kwong ..................... | H01Q 1/44 |
| 9,680,205 B2 * | 6/2017 | Li ............................. | H01Q 9/42 |
| 9,936,056 B2 * | 4/2018 | Cho ..................... | H04M 1/0266 |
| 2008/0081631 A1 | 4/2008 | Rofougaran | |
| 2010/0234071 A1 | 9/2010 | Shabtay et al. | |
| 2013/0248230 A1 * | 9/2013 | Park ........................ | G06F 3/044 |
| | | | 174/255 |
| 2013/0335278 A1 * | 12/2013 | Lin .......................... | H01Q 1/22 |
| | | | 343/702 |
| 2014/0106684 A1 * | 4/2014 | Burns .................... | H01Q 1/243 |
| | | | 455/78 |

(Continued)

OTHER PUBLICATIONS

Chen, W-S, et al. "MIMO Antenna with Wi-Fi and Blue-Tooth for Smart Watch Applications," 2015 IEEE, pp. 212-213.

(Continued)

*Primary Examiner* — Peguy Jean Pierre
(74) *Attorney, Agent, or Firm* — Schwabe, Williamson & Wyatt, P.C.

(57) ABSTRACT

Apparatuses and methods associated with an antenna formed on a transparent substrate are disclosed herein. In embodiments, an electronic device may include a substrate, wherein at least a first region of a plurality of regions of the substrate is transparent; and a plurality of layers formed on the substrate, the plurality of layers including: a first transparent layer formed over the first region; and a second metal layer formed over a second region of the plurality of regions of the substrate, wherein the second metal layer comprises an antenna. Other embodiments may be disclosed or claimed.

25 Claims, 5 Drawing Sheets

(56) References Cited

U.S. PATENT DOCUMENTS

2015/0062093 A1* 3/2015 Ksondzyk .............. G01N 27/22
  345/178
2015/0303568 A1 10/2015 Yarga et al.
2016/0357223 A1* 12/2016 Kim ...................... G06F 1/1613
2017/0207524 A1* 7/2017 Cardinali ............... H05K 3/284

OTHER PUBLICATIONS

SkyCross (Mar. 2014) Delivering 4×4 MIMO for LTE Mobile Devices, retrieved on Apr. 11, 2017, from URL <<www.skycross.com/docs/imat/4x4MIMO%20White%20Paper.pdf\>> 7 pages.
Marvell Avastar 88W8897 WLAN/BT/NFC SoC, retrieved on Apr. 11, 2017, from URL <<https://www.marvell.com/wireless/avastar/88W8897/>>, 2 pages.

* cited by examiner

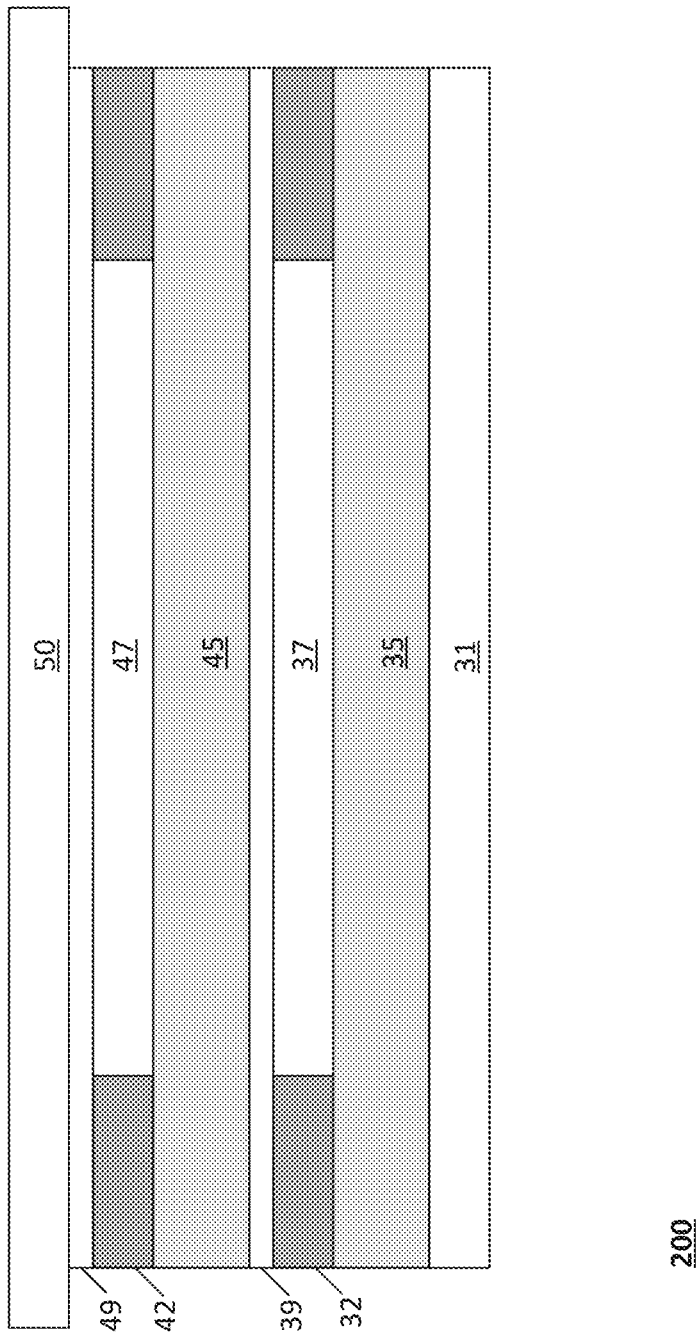

ANTENNA ON TRANSPARENT SUBSTRATE

TECHNICAL FIELD

The present disclosure relates to the field of electronic devices utilizing antennas and displays, for example, touch panels. More specifically, the present disclosure is related to an antenna on a transparent substrate.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

With advances in integrated circuits and computing technology, portable wearable computer devices, such as smart watches, are becoming increasingly popular. Some wearable computer devices such as connected wearable devices may support BT (Bluetooth®), BT LE (low energy), Wi-Fi, NFC (near field communications), LTE (long term evolution), or the like, or combinations thereof.

To support these protocols and maintain a small form factor, antenna placement may be important. In a wrist worn device supporting Bluetooth and/or Wi-Fi, a metal body of the wrist worn device may be electrically coupled to the Bluetooth transceiver and/or Wi-Fi transceiver to be utilized as the antenna. In another example of compact design, in an electronic device including an NFC antenna and a touch panel, an indium tin oxide (ITO layer) of the touch panel may be electrically coupled to an NFC communication engine to be utilized as the NFC antenna.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 3 illustrates a cross-section view of a touch module including antennas on transparent substrates of receive and transmits sections of the touch module.

DETAILED DESCRIPTION

Figure 1:
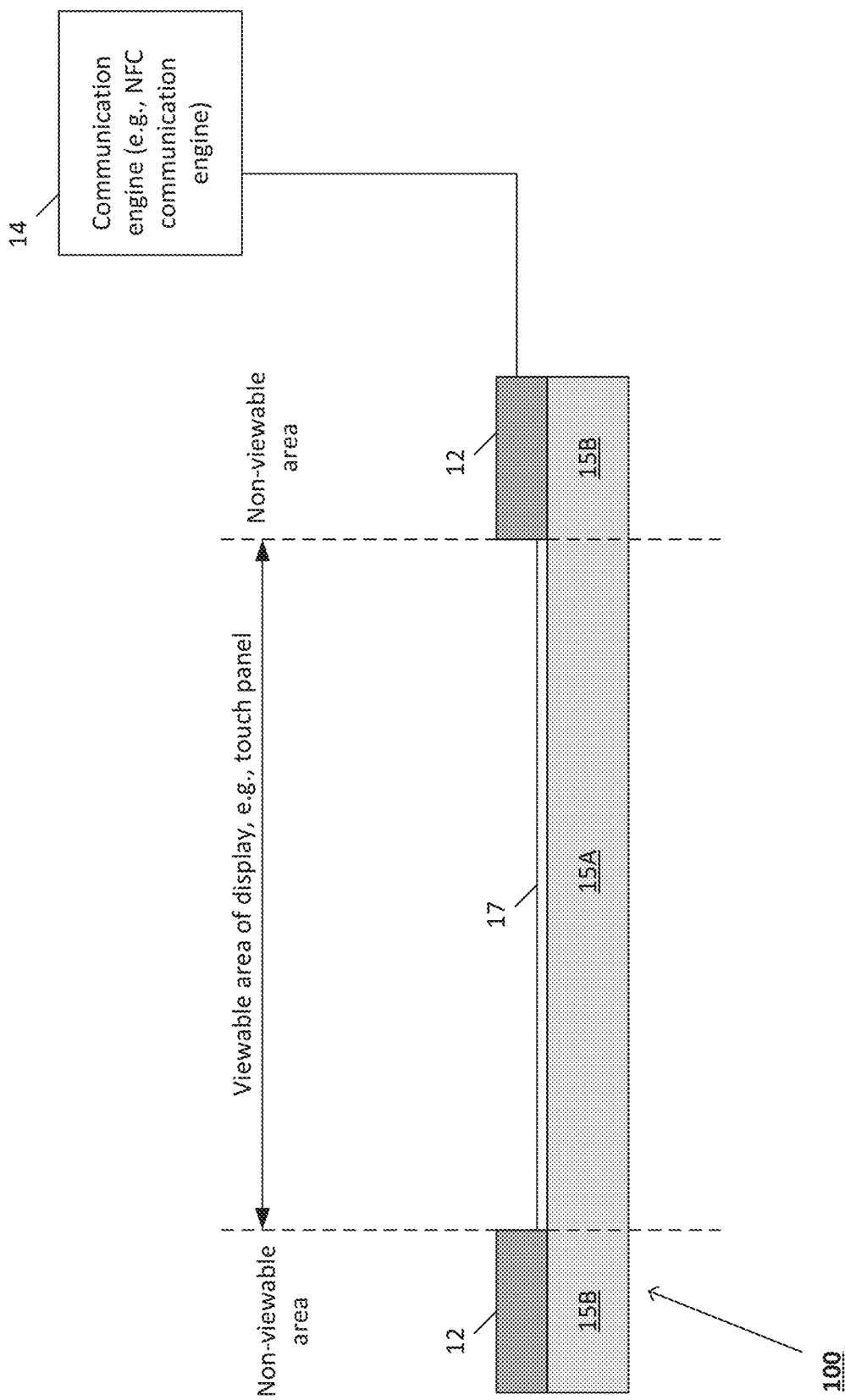
FIG. 1 illustrates a cross-section view of a system including an antenna on a transparent substrate.

Apparatuses, methods and storage medium associated with an antenna on a transparent substrate are disclosed herein. In embodiments, an electronic device may include a substrate, wherein at least a first region of a plurality of regions of the substrate is transparent; and a plurality of layers formed on the substrate, the plurality of layers including: a first transparent layer formed over the first region; and a second metal layer formed over a second region of the plurality of regions of the substrate, wherein the second metal layer comprises an antenna.

In the description to follow, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Operations of various methods may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted, split or combined in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used hereinafter, including the claims, the term "module" or "routine" may refer to, be part of, or include an Application Specific Integrated Circuit (ASIC), an electronic circuit, a processor (shared, dedicated, or group) and/or memory (shared, dedicated, or group) that execute one or more software or firmware programs having executable instructions, a combinational logic circuit, and/or other suitable components that provide the described functionality.

An NFC antenna design may integrate an NFC antenna with a display via placement of a ferrite backed coil under a low density LCD (liquid-crystal display) display. The use of the ferrite backed coil under a low density LCD display may provide a sufficient quality factor (Q) value to fulfill NFC system properties needed for proper Tx/Rx functionalities. The Q value of an antenna refers to a ratio of stored energy to lost energy for a given periodic cycle of the given system. However, in a higher density display, use of the ferrite backed coil may be undesirable and/or unfeasible for a variety of reasons.

In another NFC antenna design for a device including a touch panel, a transparent conducting oxide film of the touch panel may be electrically coupled to an NFC communication engine to be utilized as the antenna. However, the transparent conducting oxide may have a relatively high resistivity and for this and/or other reasons, such a system may also have an undesirably low Q value. Some embodiments herein may include low impedance and/or a high Q value integrated single-ended and/or differential fed NFC antenna within a touch module layer. The antenna may be composed of a material having higher conductivity than a transparent conducting oxide.

In some embodiments, an NFC stack-up of some embodiments may be thinner than a legacy NFC stack-up that includes ferrite polymer composite (FPC), ferrite, and adhesives. The reduced thickness NFC stack-up may be used for a thin device including a touch panel and an antenna formed on a transparent substrate of the touch panel.

FIG. 1 illustrates a cross-section view of a system including an antenna on a transparent substrate 100, such as polyethylene terephthalate (PET). The transparent substrate 100 may include a first substrate region 15A of a viewable area of a display (e.g., a touch panel), and a second substrate region 15B, which may surround (e.g., fully surround) the first substrate region 15A and may or may not be transparent. A transparent layer 17, for example, a transparent conductive oxide such as an ITO film, may be formed on (e.g., deposited on) the first substrate region 15A.

One or more layers 12 to provide a conductive structure (e.g., a metal, such as Ag) may be formed on the second substrate region 15B. In some embodiments, the one or more layers 12 may not include any portion of the transparent layer 17, and in such examples the conductive structure of the one or more layers 12 may be formed directly on the substrate region 15B. In other embodiments, the transparent layer 17 may extend over both substrate regions 15A-B, and the conductive structure may be formed on a dielectric layer formed on a portion of the transparent layer 17 on the second substrate region 15B. The conductive structure of the one or more layers 12 may be electrically connected to a communication engine 14 (e.g., to differential outputs of an NFC communication engine, an RF engine, or the like, or combination thereof).

Figure 2A:
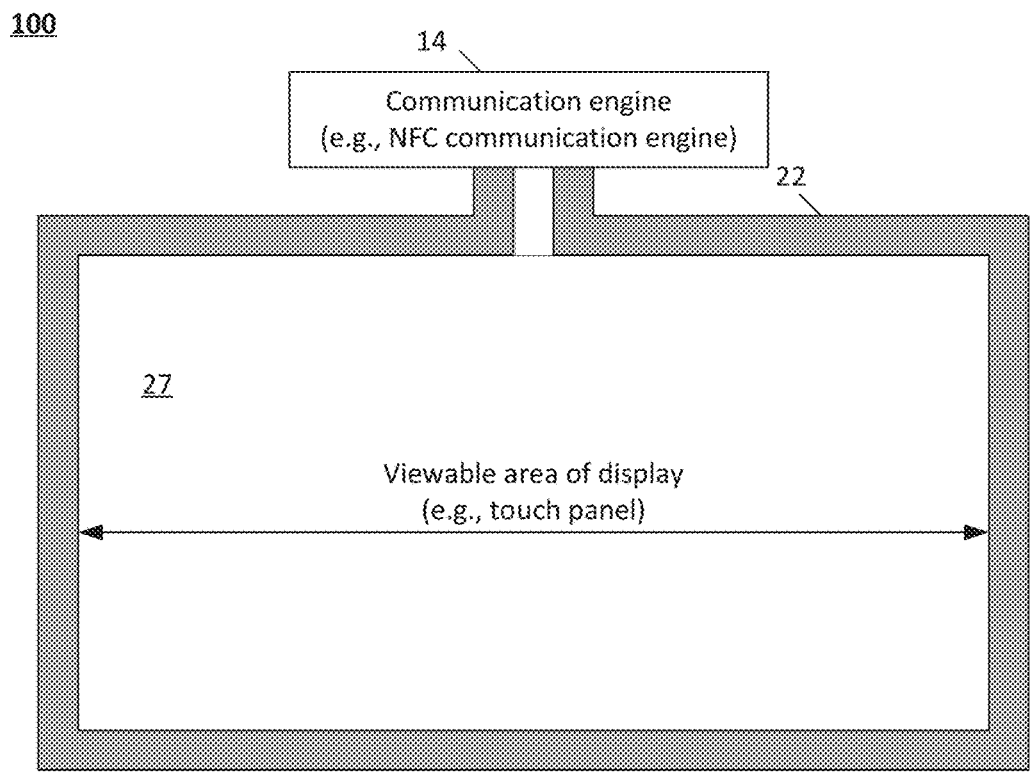
FIG. 2A illustrates a top view of the antenna of the system of FIG. 1.
Figure 2B:
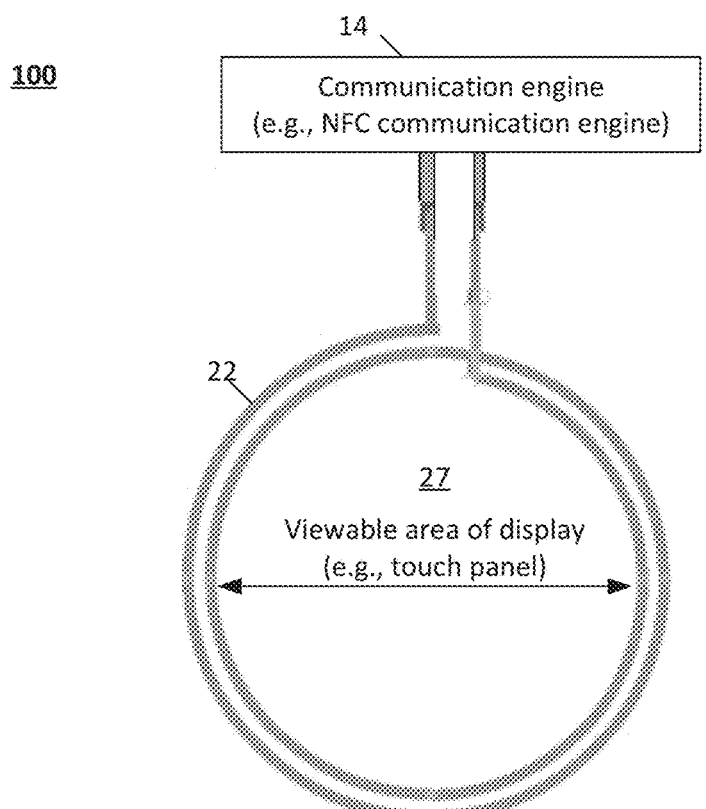
FIG. 2B illustrates a top view of an example dual loop antenna of the system of FIG. 1.

FIG. 2A illustrates a top view of an antenna 22 that includes the conductive structure of the one or more layers 12 of FIG. 1. In the illustrated embodiment, the antenna 22 is a single loop antenna; however, in other examples the antenna may include more than one loop. For example, FIG. 2B illustrates a top view of an example dual loop antenna 22 that includes the conductive structure of the one or more layers 12 of FIG. 1. In the illustrated embodiment of FIG. 2A, a shape of the antenna 22 corresponds to a perimeter of a rectangular display 27. However, in other examples an antenna may be a shape that does not correspond to the perimeter of a rectangular display. For instance, a round shaped antenna, such as the antenna 22 shown by FIG. 2B, may be utilized in a watch with a rectangular display. In this example, a rectangle coinciding with a perimeter of a rectangular display may fit inside a circle to which a round-shaped antenna corresponds. Additionally, in the illustrated embodiment of FIG. 2B, the shape of the antenna 22 may correspond to a perimeter of a circular display 27. The antenna 22 may include terminals coupled directly to the communication engine 14, or in other embodiments the terminals may be connected though other components (wires and/or a touch panel flex, etc.) that connect the antenna 22 and the communication engine 14.

Some embodiments include a touch module (e.g., a resistive touch module and/or a capacitive touch panel module) with an integrated differential fed NFC antenna pattern. The antenna pattern may incorporate a same metal used for touch panel routing and may include a differential feeding design. The antenna pattern may run along an outer periphery of sensor electrode routing, and may be separated from sensor lines of the touch panel via ground lines. Referring to FIG. 1, the one or more layers 12 may include the antenna 22 and at least one of a routing component and/or an ESD (electrostatic discharge) protection component.

A differential fed NFC antenna pattern may be connected to a circuit board corresponding to the communication engine using available touch panel flex. A galvanic connection between the NFC antenna pattern and NFC signal lines on the touch panel flex may be formed using an ACF (anisotropic conductive film) bonding process in some embodiments.

The improved Q-value differential fed NFC antenna design as compared to an ITO line based design may be substantial. Some embodiments including the features described herein may have 300 nH and 1 for the inductance and Q values, respectively, and/or may have ten times or more improvement of at least some parameters such as the Q value compared to an ITO line based design. The utilization of metals of touch panel routing technology may reduce losses due to the lower metal sheet resistance. A single-fed NFC antenna design can be also utilized by terminating one of the antenna lines with available grounding traces.

The NFC antenna may be part of one or both of an Rx layer and/or Tx layer of a touch module. For instance, the transparent substrate 100 may be of a transparent substrate of an Rx layer or a Tx layer of a touch module.

Transparent substrate 100 may be formed from a single layer or may include more than one layer laminated together or otherwise integrated to form the transparent substrate 100. A layer or material described as transparent may be optically permissible to at least some wavelengths of visible light. A transparent layer or material may appear non-opaque, for example, clear, tinted, translucent, or the like.

FIG. 3 illustrates a cross-section view of a touch module 200 including antennas on transparent substrates 35 and 45 of receive and transmits sections of the touch module 200. Transparent substrate 35 may be similar to the transparent substrate 100 (FIG. 1). Transparent substrate 35 may correspond to one of receive or transmit sections of the touch module 200, and may be formed on a display stack 31 of a touch module. The other substrate 45 may be of the other of the receive section and transmit section of the touch module 200. Transparent layers 37 and 47 may be formed on transparent substrates 35 and 45, respectively, and may be similar to transparent layer 17 (FIG. 1). One or more layers 32 and one or more layers 42 may be formed on the transparent substrates 35 and 45, respectively, and may be similar to one or more layers 12 (FIG. 1). Antennas corresponding to the illustrated one or more layers 32 and the one or more layers 42 may be electrically coupled to transmit and receive modules of a transceiver and/or communication engine.

A cover lens 50 (e.g., glass) may be coupled to the one or more layers 42 and/or the transparent layer 47 via an OCA (optical clear adhesive) 49. Also, an OCA 39 may couple the receive section and the transmit sections (e.g., OCA 39 may couple transparent substrate 45 to one or more layers 32 and/or transparent layer 37, as illustrated).

Figure 4:
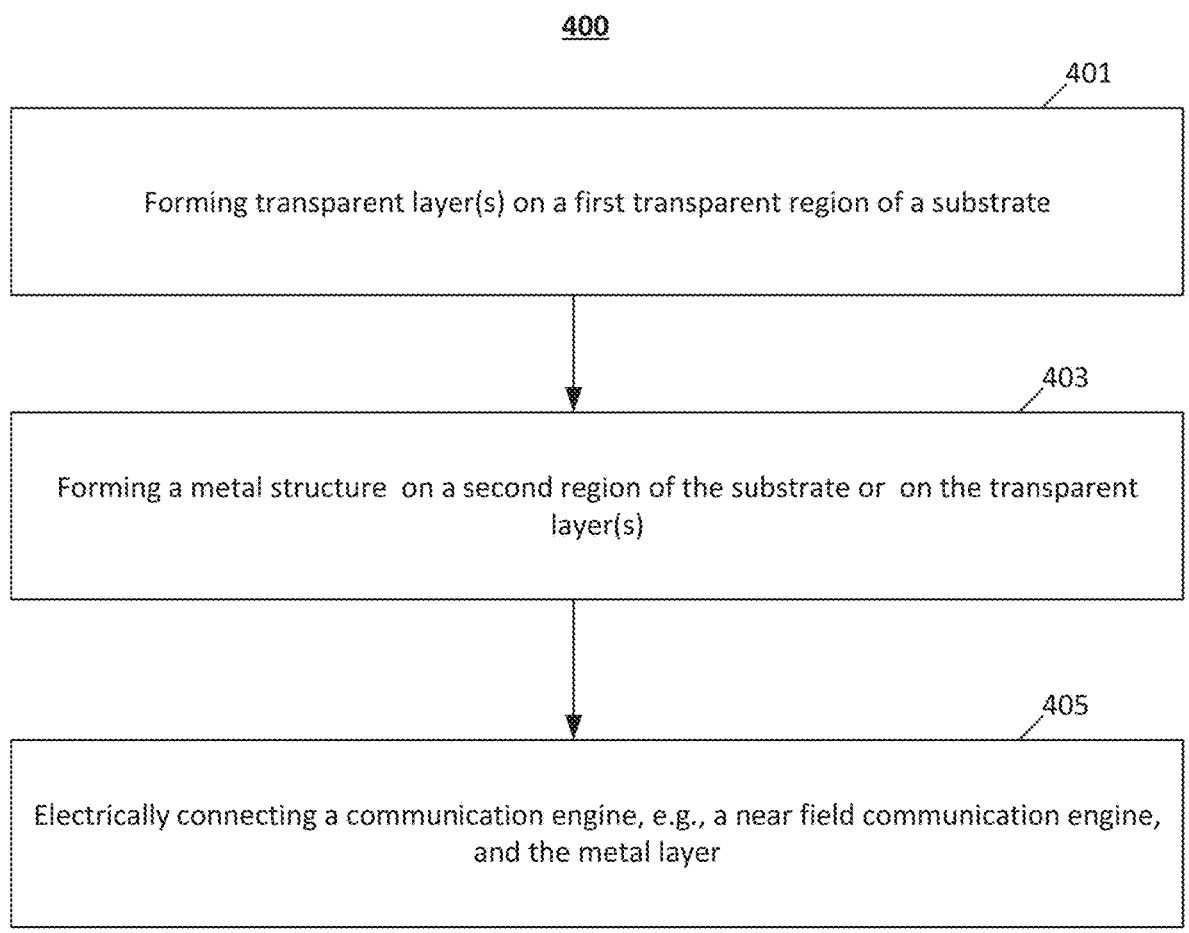
FIG. 4 is a flow chart showing a process of forming an antenna on a transparent substrate.

FIG. 4 is a flow chart showing a process 400 of forming an antenna on a transparent substrate. In block 401, a transparent layer(s) is/are formed on (e.g., directly on) a first transparent region of a substrate. In some examples, an IMO layer may be deposited on a transparent substrate, which may include PET.

In block 403, a metal structure is formed on (e.g., directly on) a second region of the substrate, or on (e.g., directly on) the transparent layer(s). In some embodiments, the transparent layer(s) include a transparent conducting oxide layer and a transparent dielectric layer, and the metal structure may be formed on the transparent dielectric layer. In some embodiments, formation of the metal structure may include deposition of dielectric layers, deposition of conductive layers, etching, or the like, or combinations thereof, to form a high efficiency antenna made of a conductor having conductivity greater than ITO and/or transparent conducting oxides. These conductive and/or dielectric layers may be formed during a same process in which conductive and/or dielectric layers of routing and/or ESD protection components are formed. In some examples, the metal structure is used for touch panel routing and/or ESD protection and/or may be formed together with formation of routing and/or ESD protection structures. Some embodiments herein may utilize touch panel routing metal manufacturing technology. In some examples, the antenna may be made of more than one layer of the conductor, for example, in a dual loop antenna implementation (see e.g., FIG. 2B).

In block 405, a transceiver or communication engine (e.g., an NFC communication engine) is electrically connected to the metal structure. Block 405 may include forming a wire to couple the metal structure to provide the electrical connection.

Figure 5:
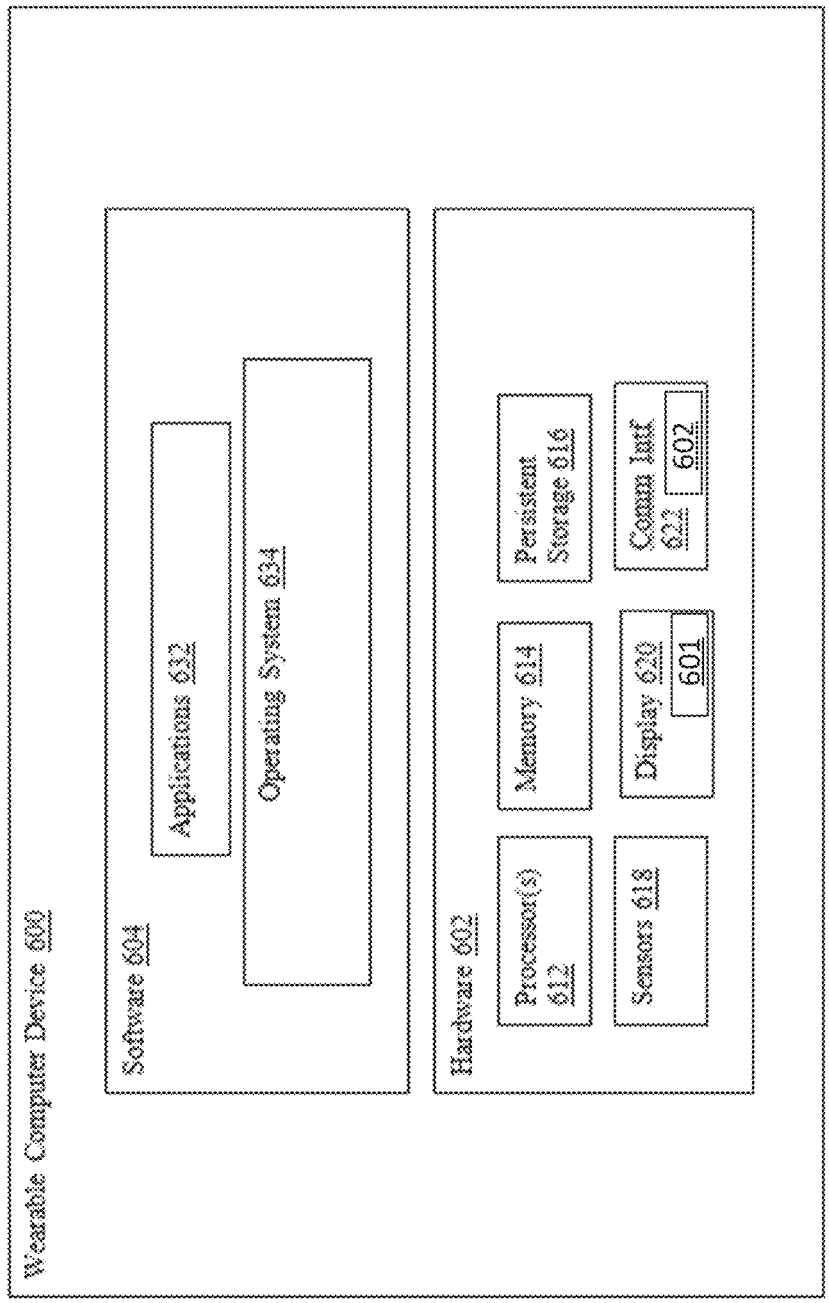
FIG. 5 illustrates example architecture of a wearable computer device, in accordance to various embodiments.

FIG. 5 illustrates example architecture of a wearable computer device 500, in accordance to various embodiments. The wearable computer device 600 may include a communication interface 622 including an antenna 602 and a display 620 may include a touch panel component 601 including a transparent substrate on which the antenna 602 is formed on.

As illustrated, in embodiments, wearable computer device 600 may include hardware 602 and software 604. Hardware 602 may include one or more components such as processor(s) 612, memory 614, persistent storage 616, sensors 618, the display 620, and the communication interface 622. Communication interface 622 may include any number of wireless communication or networking interfaces known, such as WiFi, 3G/4G, Bluetooth®, Near Field Communication, LiFi, and so forth. In some examples, the antenna 602 may be an antenna to support one or more of the wireless communication or networking interfaces of the communication interface 622 (such as an NFC antenna). Display 620 may be any known display device, including, for example, a touch panel or touch sensitive screen.

Processor(s) 612 may be any one of a number of processors known in the art, each having one or more processor cores. Memory 614 may be any known volatile or non-volatile memory in the art, suitable for storing instructions for execution and working data, in particular, instructions and data of applications 632 and OS 634. Memory 614 may include a hierarchy of cache memory and system memory. Both the cache and system memory may be respectively organized into segments and pages. Persistent storage 616 may be any known persistent mass storage suitable for providing persistent storage of instructions and data of applications 632 and OS 634, for example, solid state storage, magnetic or optical disk drives. Sensors 618 may include any known sensors of a wearable device. Software 604 may include operating system (OS) 634 and application 632. OS 634 may be any one of a number of wearable computer device OS known in art. Applications 632 may likewise be any one of a number of known applications for wearable computer devices, for example, personal health application, calendar or other personal information management (PIM) applications.

EXAMPLES

Example 1 may be an electronic device, comprising: a substrate, wherein at least a first region of a plurality of regions of the substrate is transparent; and a plurality of layers formed on the substrate, the plurality of layers including: a first transparent layer formed over the first region; and a second metal layer formed over a second region of the plurality of regions of the substrate, wherein the second metal layer comprises an antenna.

Example 2 may include the subject matter of example 1, and a near field communication engine electrically connected to the antenna.

Example 3 may include the subject matter of any of example 1-2, and the second metal layer is formed on the first transparent layer.

Example 4 may include the subject matter of any of example 1-3, and the first transparent layer comprises a transparent conductive oxide.

Example 5 may include the subject matter of any of example 1-4, and the transparent conductive oxide comprises indium tin oxide.

Example 6 may include the subject matter of any of example 1-5, and the second metal layer comprises Ag.

Example 7 may include the subject matter of any of examples 1-6, and the first region corresponds to an active area of a touch display panel and the second region corresponds to a non-active area on a periphery of the active area.

Example 8 may include the subject matter of any of examples 1-7, and the plurality of layers and the substrate are of one of a receive section and a transmit section of a touch display panel, and wherein the other of the receive section and the transmit section comprises: an additional substrate, wherein at least a region of a plurality of regions of the additional substrate is transparent; and one or more layers formed on the additional substrate, the one or more layers including a transparent layer formed over the region of the additional substrate.

Example 9 may include the subject matter of any of examples 1-8, and an optical clear adhesive (OCA) between the receive section and the transmit section.

Example 10 may include the subject matter of any of examples 1-9, and an additional OCA between a cover lens and at least one of the receive section and the transmit section.

Example 11 may be an electronic device, comprising: a touch panel display receive section including an active area and a routing area formed on a periphery of the active area and electrically coupled to said active area; and a touch panel display transmit section including an active area and a routing area formed on a periphery of the active area and electrically coupled to said active area; wherein at least one of the routing areas is electrically coupled to a wireless communication module of the electronic device and includes wiring arranged in one or more loops to operate as an antenna for the wireless communication module.

Example 12 may include the subject matter of example 11, and the wireless communication module comprises a near field communication engine.

Example 13 may include the subject matter of any of examples 11-12, and the active area comprises a transparent conductive layer of a first material and the routing area comprises a metal layer of a second material that is different than the first material.

Example 14 may include the subject matter of any of examples 11-13, and the first material comprises indium tin oxide (ITO) and the second material comprises silver (Ag).

Example 15 may include the subject matter of any of examples 11-14, and the metal layer is formed on the transparent conductive layer.

Example 16 may be a method, comprising: providing a substrate, wherein at least a first region of a plurality of regions of the substrate is transparent; forming one or more transparent layers on the first region of the substrate; and forming a metal layer on a second region of the plurality of regions of the substrate or on the one or more transparent layers, over the second region.

Example 17 may include the subject matter of example 16, and the metal layer comprises a wire formed in one or more loops to be coupled to a wireless communication module and to operate as an antenna for the wireless communication module.

Example 18 may include the subject matter of any of examples 16-17, and the metal layer is electrically coupled to at least one of the one or more transparent layers.

Example 19 may include the subject matter of any of examples 16-18, and the one or more one or more transparent layers comprises an optical clear adhesive (OCA).

Example 20 may include the subject matter of any of examples 16-19, and coupling a cover lens to the one or more transparent layers.

Example 21 may be a system, comprising: a touch panel display; and a processor to output data to be displayed on the touch panel display, to receive an input from the touch panel display; wherein the touch panel display includes: a touch panel display receive section including an active area and a routing area formed on a periphery of the active area and electrically coupled to said active area; and a touch panel display transmit section including an active area and a routing area formed on a periphery of the active area and electrically coupled to said active area; wherein at least one of the routing areas is electrically coupled to a wireless communication module and includes wiring arranged in one or more loops to operate as an antenna for the wireless communication module.

Example 22 may include the subject matter of example 21, and the wireless communication module comprises a near field communication engine.

Example 23 may include the subject matter of any of examples 21-22, and the active area comprises a transparent conductive layer of a first material and the routing area comprises a metal layer of a second material that is different than the first material.

Example 24 may include the subject matter of any of examples 21-24, and the first material comprises indium tin oxide (ITO) and the second material comprises silver (Ag).

Example 25 may include the subject matter of any of examples 21-24, and the metal layer is formed on the transparent conductive layer.

Example 26 may include an apparatus comprising means for electrically sensing contact with a display of an electronic device; and means for converting one of electromagnetic radiation and electrical power into the other of the electromagnetic radiation and power to perform at least one of transmission or reception of a signal to or from a device in proximity to the electronic device; wherein the electrically sensing means is formed over a first transparent region of a substrate of the electronic device and the converting means is formed over a second region of the substrate.

Example 27 may include the subject matter of example 26, and the converting means is formed on the electrically sensing means.

Example 28 may include the subject matter of any of examples 26-27, and a material of the electrically sensing means comprises a transparent conductive oxide.

Example 29 may include the subject matter of any of examples 26-28, and a material of the converting means comprises a metal that is different than the transparent conductive oxide.

Example 30 may include the subject matter of any of examples 26-29, and the material of the converting means comprises Ag.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. An electronic device, comprising:
    a substrate comprising a plurality of substrate regions, wherein the plurality of substrate regions comprises a first substrate region that is transparent and a second substrate region; and
    a plurality of layers formed on the substrate, the plurality of layers including:
        a first transparent layer formed over the first substrate region; and
        a second metal layer formed over the second substrate region and surrounding the first transparent layer formed over the first substrate region, wherein the second metal layer comprises an antenna.

2. The electronic device of claim 1, further comprising a near field communication engine electrically connected to the antenna.

3. The electronic device of claim 1, wherein the second metal layer is formed on the first transparent layer.

4. The electronic device of claim 1, wherein the first transparent layer comprises a transparent conductive oxide.

5. The electronic device of claim 4, wherein the transparent conductive oxide comprises indium tin oxide.

6. The electronic device of claim 1, wherein the second metal layer comprises Ag.

7. The electronic device of claim 1, wherein the first substrate region corresponds to an active area of a touch display panel and the second substrate region corresponds to a non-active area on a periphery of the active area.

8. The electronic device of claim 1, wherein the plurality of layers and the substrate are of one of a receive section and a transmit section of a touch display panel, and wherein the receive section and the transmit section comprises:
    an additional substrate, wherein at least a region of a plurality of regions of the additional substrate is transparent; and
    one or more layers formed on the additional substrate, the one or more layers including a transparent layer formed over the region of the additional substrate.

9. The electronic device of claim 8, further comprising an optical clear adhesive (OCA) between the receive section and the transmit section.

10. The electronic device of claim 9, further comprising an additional OCA between a cover lens and at least one of the receive section and the transmit section.

11. An electronic device, comprising:
a touch panel display receive section of a touch panel, the touch panel display receive section including a first region of a first transparent substrate arranged as an active area and a second region of the first transparent substrate arranged as a routing area formed on a periphery of the active area and electrically coupled to said active area;
a first transparent layer formed on the first region of the first transparent substrate;
a first metal layer formed on the second region of the first transparent substrate and surrounding the first transparent layer formed on the first region of the first transparent substrate;
a touch panel display transmit section of the touch panel, the touch panel display transmit section including a first region of a second transparent substrate arranged as an active area and a second region of the second transparent substrate arranged as a routing area formed on a periphery of the active area and electrically coupled to said active area;
a second transparent layer formed on the first region of the second transparent substrate; and
a second metal layer formed on the second region of the second transparent substrate and surrounding the second transparent layer formed on the first region of the second transparent substrate,
wherein at least one of the routing areas is electrically coupled to a wireless communication module of the electronic device and includes wiring arranged in one or more loops that surround the touch panel to operate as an antenna for the wireless communication module.

12. The electronic device of claim 11, wherein the wireless communication module comprises a near field communication engine.

13. The electronic device of claim 11, wherein the active area comprises a transparent conductive layer of a first material and the routing area comprises a metal layer of a second material that is different than the first material.

14. The electronic device of claim 13, wherein the first material comprises indium tin oxide (ITO) and the second material comprises silver (Ag).

15. The electronic device of claim 13, wherein the metal layer is formed on the transparent conductive layer.

16. A method, comprising:
providing a substrate, wherein the substrate comprises a plurality of substrate regions, wherein the plurality of substrate regions comprises a first substrate region that is transparent and a second substrate region that surrounds the first substrate region;
forming one or more transparent layers on the first substrate region; and
forming a metal layer on the second substrate region such that the metal layer surrounds the one or more transparent layers formed over the first substrate region, the metal layer not being formed on the one or more transparent layers or the metal layer being formed on a portion of the one or more transparent layers that extend over the second substrate region, and wherein the second metal layer comprises an antenna.

17. The method of claim 16, wherein the metal layer comprises a wire formed in one or more loops around the one or more transparent layers to be coupled to a wireless communication module and to operate as an antenna for the wireless communication module.

18. The method of claim 16, wherein the metal layer is electrically coupled to at least one of the one or more transparent layers.

19. The method of claim 16, wherein the one or more transparent layers comprises an optical clear adhesive (OCA).

20. The method of claim 16, further comprising coupling a cover lens to the one or more transparent layers.

21. A system, comprising:
a touch panel display; and
a processor to output data to be displayed on the touch panel display, to receive an input from the touch panel display;
wherein the touch panel display includes:
a touch panel display receive section including a first region of a first transparent substrate arranged as an active area and a second region of the first transparent substrate arranged as a routing area formed on a periphery of the active area and electrically coupled to said active area;
a first transparent layer formed on the first region of the first transparent substrate;
a first metal layer formed on the second region of the first transparent substrate and surrounding the first transparent layer formed on the first region of the first transparent substrate;
a touch panel display transmit section including a first region of a second transparent substrate arranged as an active area and a second region of the second transparent substrate arranged as a routing area formed on a periphery of the active area and electrically coupled to said active area;
a second transparent layer formed on the first region of the second transparent substrate; and
a second metal layer formed on the second region of the second transparent substrate and surrounding the second transparent layer formed on the first region of the second transparent substrate,
wherein at least one of the routing areas is electrically coupled to a wireless communication module and includes wiring arranged in one or more loops surrounding the touch panel display to operate as an antenna for the wireless communication module.

22. The system of claim 21, wherein the wireless communication module comprises a near field communication engine.

23. The system of claim 21, wherein the active area comprises a transparent conductive layer of a first material and the routing area comprises a metal layer of a second material that is different than the first material.

24. The system of claim 23, wherein the first material comprises indium tin oxide (ITO) and the second material comprises silver (Ag).

25. The system of claim 23, wherein the metal layer is formed on the transparent conductive layer.

* * * * *